(12) United States Patent  (10) Patent No.: US 7,040,658 B2
Kellas  (45) Date of Patent: May 9, 2006

(54) DEPLOYABLE RIGID SYSTEM FOR CRASH ENERGY MANAGEMENT

(75) Inventor: Sotirios Kellas, Yorktown, VA (US)

(73) Assignee: General Dynamics Advanced Information Systems, Inc., Arlington, VA (US)

( * ) Notice: Subject to any disclaimer, the term of this patent is extended or adjusted under 35 U.S.C. 154(b) by 6 days.

(21) Appl. No.: 10/755,361

(22) Filed: Jan. 13, 2004

(65) Prior Publication Data

US 2004/0140658 A1   Jul. 22, 2004

Related U.S. Application Data

(62) Division of application No. 10/230,468, filed on Aug. 29, 2002, now Pat. No. 6,755,453.

(51) Int. Cl.
 *B60R 21/04* (2006.01)
(52) U.S. Cl. ..................................... 280/751
(58) Field of Classification Search ............... 280/751; 297/488; 296/35.2, 189; 267/64.27
 See application file for complete search history.

(56) References Cited

U.S. PATENT DOCUMENTS

| 2,973,172 | A | * | 2/1961 | Bixby ......................... 188/268 |
| 3,339,673 | A | | 9/1967 | Schafer ......................... 188/1 |
| 3,552,525 | A | | 1/1971 | Schudel |
| 3,744,835 | A | * | 7/1973 | Carbone et al. ............. 293/120 |
| 4,142,599 | A | | 3/1979 | Schmitt ......................... 180/21 |
| 4,221,413 | A | * | 9/1980 | Bonnetain .................... 293/122 |
| 4,227,593 | A | * | 10/1980 | Bricmont et al. ............ 293/133 |
| 4,522,284 | A | * | 6/1985 | Fearon et al. ................ 181/292 |
| 4,803,108 | A | * | 2/1989 | Leuchten et al. ............ 428/118 |
| 4,844,213 | A | * | 7/1989 | Travis ......................... 188/377 |
| 4,852,704 | A | * | 8/1989 | Brockenbrough et al. .. 188/376 |
| 5,069,318 | A | * | 12/1991 | Kulesha et al. .............. 188/377 |
| 5,098,124 | A | * | 3/1992 | Breed et al. ................. 280/751 |
| 5,306,066 | A | * | 4/1994 | Saathoff ................. 296/187.12 |
| 5,333,665 | A | * | 8/1994 | Safar ......................... 160/84.05 |
| 5,349,893 | A | * | 9/1994 | Dunn ......................... 89/36.05 |
| 5,356,177 | A | * | 10/1994 | Weller ......................... 280/751 |
| 5,403,112 | A | * | 4/1995 | Carney, III .................... 404/6 |
| 5,427,983 | A | * | 6/1995 | Ahmad et al. ................ 427/99 |
| 5,454,589 | A | * | 10/1995 | Bosio et al. ................. 280/729 |
| 5,524,641 | A | * | 6/1996 | Battaglia ..................... 128/846 |
| 5,715,757 | A | * | 2/1998 | Dannawi et al. ........ 296/187.03 |
| 5,746,419 | A | * | 5/1998 | McFadden et al. ......... 188/377 |
| 5,746,537 | A | | 5/1998 | Kellas et al. |
| 5,915,876 | A | * | 6/1999 | Barbazza ..................... 188/377 |
| 5,959,552 | A | * | 9/1999 | Cho ......................... 280/730.2 |
| 5,997,077 | A | * | 12/1999 | Siebels et al. ......... 296/187.12 |
| 6,085,878 | A | * | 7/2000 | Araki et al. ................. 188/377 |
| 6,086,098 | A | * | 7/2000 | Reiter et al. ................. 188/377 |

(Continued)

OTHER PUBLICATIONS

"Investigation of a Compartmented-Gas-Bag Landing System Having Multiple-Impact Capabilities," by John R. McGehee, NASA Technical Note NASA TN D-4710, published by NASA, Washington, D.C., Aug. 1968.

(Continued)

*Primary Examiner*—Faye M. Fleming
(74) *Attorney, Agent, or Firm*—Steptoe & Johnson LLP

(57) ABSTRACT

A deployable cellular structure providing impact energy absorption capability is disclosed. The structure may be packed when not in use and deployed automatically or manually to provide impact protection. The structure is useful in a variety of situations including vehicular protection of occupants, deployable highway safety barriers, and aviation emergency safety devices.

19 Claims, 17 Drawing Sheets

U.S. PATENT DOCUMENTS

| | | | | |
|---|---|---|---|---|
| 6,142,563 A | * | 11/2000 | Townsend et al. | 297/216.1 |
| 6,158,771 A | * | 12/2000 | Nusser et al. | 296/187.05 |
| 6,245,408 B1 | * | 6/2001 | Bitzer | 428/118 |
| 6,327,813 B1 | * | 12/2001 | Ishiwatari | 43/125 |
| 6,372,311 B1 | * | 4/2002 | McCormack | 293/128 |
| 6,457,755 B1 | * | 10/2002 | Nieto | 293/128 |
| 6,547,280 B1 | * | 4/2003 | Ashmead | 280/751 |
| 6,554,529 B1 | * | 4/2003 | Stephens et al. | 404/6 |
| 6,595,502 B1 | * | 7/2003 | Koch et al. | 188/377 |
| 6,623,204 B1 | * | 9/2003 | Buehler | 404/6 |
| 6,682,128 B1 | * | 1/2004 | Carroll et al. | 296/187.03 |

OTHER PUBLICATIONS

"Cushioning for Air Drop, Part VII, Characteristics of Foamed Plastics Under Dynamic Loading," by James W. Turnbow, prepared for Quartermaster Research and Development Command, The University of Texas, Structural Mechanics Research Laboratory, Austin, Texas, Mar. 28, 1957.

"Foam Impact Attenuation System," by S. R. Mehaffie, AIAA 6th Aerodynamics Decelerator and Baloon Technology Conference, Houston, Texas, Mar. 5-7, 1979.

* cited by examiner

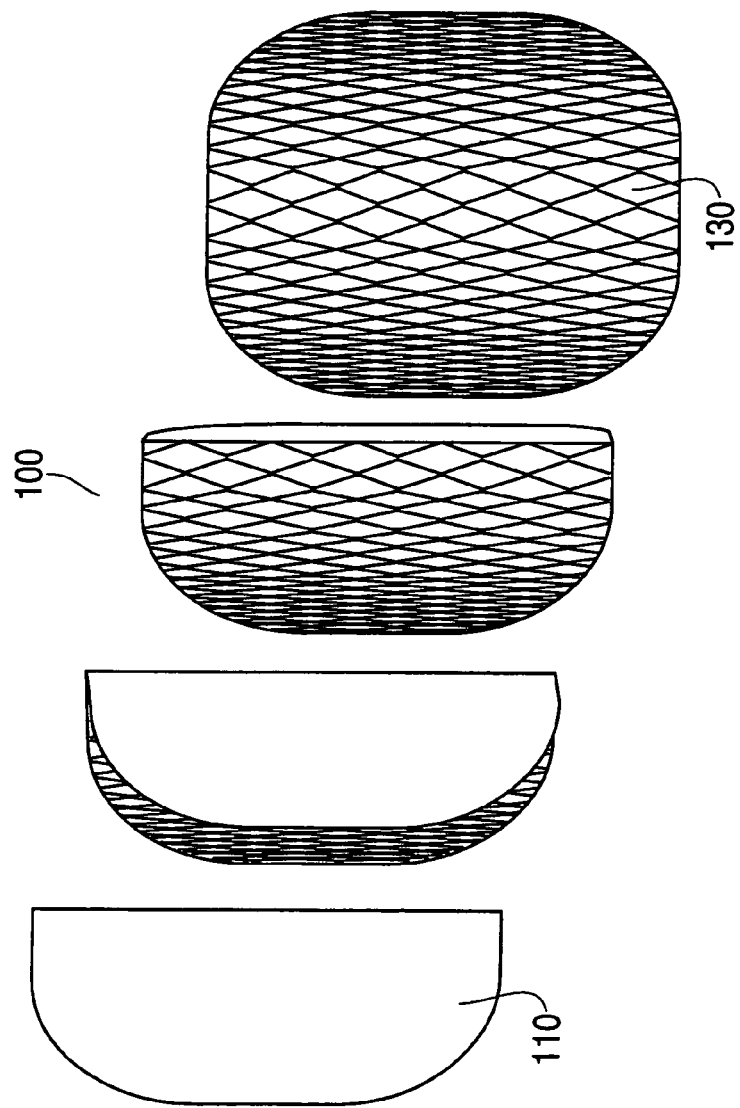

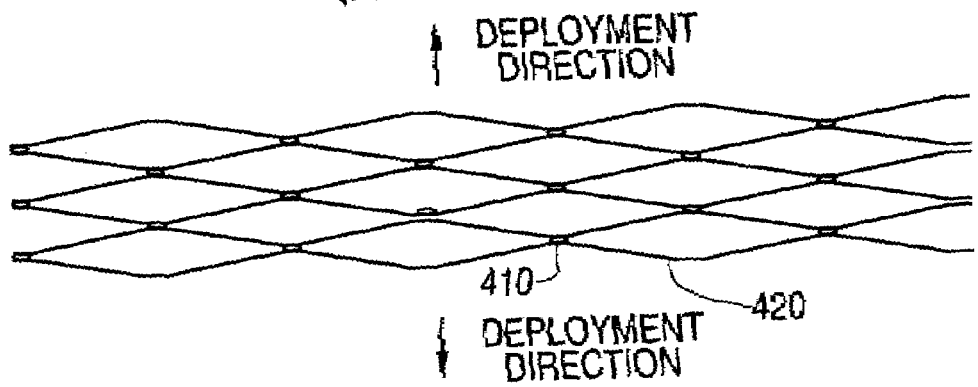
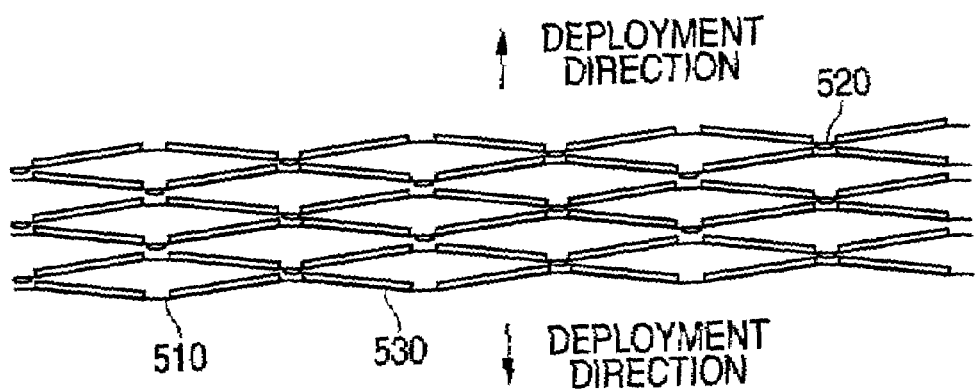

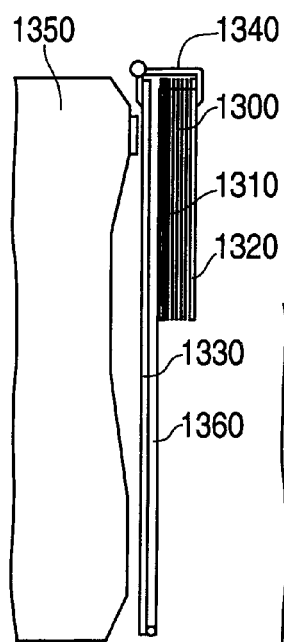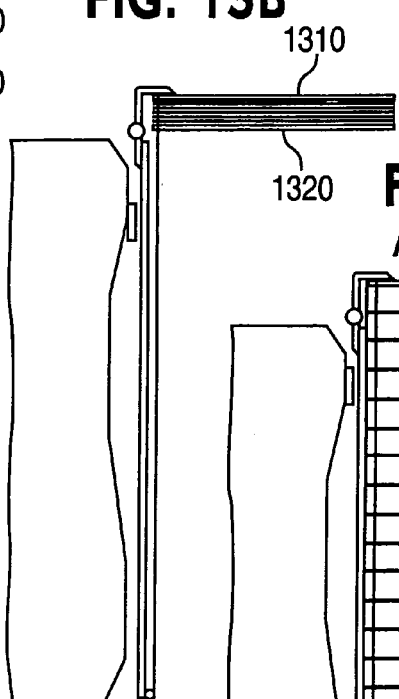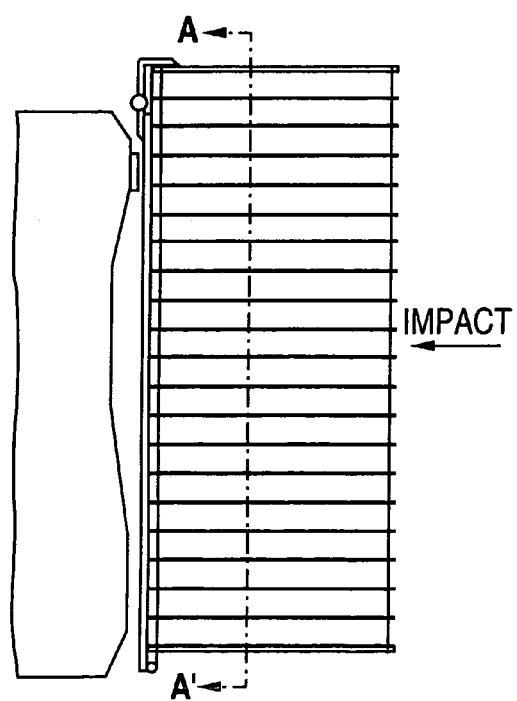

DEPLOYABLE RIGID SYSTEM FOR CRASH ENERGY MANAGEMENT

This application is a divisional of application Ser. No. 10/230,468, filed Aug. 29, 2002 now U.S. Pat. No. 6,755,453.

BACKGROUND OF THE INVENTION

1. Field of the Invention

The invention relates to a deployable rigid system for managing crash energy. More particularly, the invention relates to an expandable cellular structure for absorbing impact energy.

2. Discussion of Background Information

Airbags are a common device for absorbing crash energy. Many vehicles such as automobiles use airbags internally, and space vehicles such as the Mars Pathfinder have used them externally. Such airbags have a variety of drawbacks.

Airbags are ill-equipped to deal with shear forces due to impact. As a result, airbags are generally limited to uses where the direction of impact is known prior to installation. To improve shear stability, large airbags are often designed with several compartments and gas outlets. However, absent optimal conditions airbags are likely to momentarily store energy before releasing it in a trampoline-like effect.

Airbags are also sensitive to the surface area and shape of the impacting object. Objects with small impact profiles are likely to have less kinetic energy dissipated by the airbag. That is, if an impacting object contacts only a small portion of an airbag's area, the airbag will likely deform in such a way that does not provide sufficient energy absorption. Moreover, an airbag can rupture and fail when hit by an object having sharp edges or projections.

Airbags require specialized servicing before they can be redeployed. When an airbag deploys, it typically expends a small explosive charge. This charge must be replaced by a specialist. Specialized servicing is also required to repack the airbag itself after it has been deployed.

Airbags are also limited to single collision protection. The gas pressure in an airbag can generally protect from at most one collision before it is lost. For example, an airbag typically expends its gas pressure upon a first impact and cannot dissipate energy from a second impact if it follows a first impact moments later.

There is also no simple way to tailor impact resistance throughout the energy-absorbing stroke of an airbag. The deformation path of an energy absorber after it is impacted by an object is known as its "crush-stroke" or "energy-absorbing stroke." At each point throughout the crush-stroke, an energy-absorbing device provides mechanical resistance (the "crush-load"), which typically dissipates an impacting object's kinetic energy by deformation, fracturing, and as heat. Airbags are usually not suitable for providing customized levels of mechanical resistance (or "load tailoring") throughout their effective energy-absorbing stroke.

Finally, airbags have relatively tight performance parameters in that a single airbag usually cannot perform effectively in a multitude of different situations. Airbags suitable for adults can (and have) caused injuries to children.

Another type of crash energy management device is a semirigid foam-filled bag. A device mixes a two-part polymer liquid and injects it under pressure into a flexible container. The mixture hardens after a time interval, usually several seconds, and provides some amount of crash protection for an aircraft so equipped. A drawback of these devices is that semirigid foam-filled bags offer negligible impact protection until the foam is sufficiently firm. Typically, there is a lag time between the initial mixing and when the mixture hardens. Therefore, semirigid foam-filled bags are typically restricted to applications where there is sufficient notice of an impending impact. Semirigid foam-filled bags are not reusable.

Semirigid foam-filled bags also do not allow for varying crush-loads throughout their energy-absorbing stroke. Because the foam used in such bags is generally homogenous, it is likely to provide the same amount of impact resistance throughout. Hence, semirigid foam-filled bags typically do not admit load tailoring.

Fixed nondeployable cellular structures such as honeycombs have been used for absorbing impact energy. However, fixed nondeployable cellular structures cannot be stowed in a space smaller than their intrinsic structure allows. That is, fixed nondeployable cellular structures occupy the same amount of space whether or not they are positioned for use. Therefore, applications of fixed nondeployable cellular structures are limited by the space available to house them.

U.S. Pat. No. 2,973,172 to Bixby ("Bixby") describes deployable paper cellular structures. Bixby discloses a landing decelerator for articles dropped in aerial delivery systems. The landing decelerator is disclosed as using expandable honeycomb structures constructed from paper.

Bixby's device is limited by its construction. Paper's in-plane isotropy places limits on the total amount of energy absorbed. Paper also places limitations on the force required to deploy Bixby's device. Because Bixby does not disclose that the cell walls and cell joints (i.e., the weld between the cells) are constructed of different materials, changing the cell wall characteristics to provide greater crush resistance would correspondingly inhibit deployment or increase the force required to deploy Bixby's device. Such increased deployment force would likely slow deployment speed.

SUMMARY OF THE INVENTION

According to a preferred embodiment of the invention, an apparatus for protecting an object from impact is provided. The apparatus includes an expandable cellular structure disposed between a first surface and a second surface, the first surface being hingedly attached to the object. The expandable cellular structure includes a plurality of cells, each of the plurality of cells has a plurality of cell walls and a plurality of joints. The plurality of cell walls are constructed from a first material, and the plurality of joints are constructed from a second material different from the first material. The apparatus is configured to be deployed prior to an impact upon the object.

Various optional and preferable features of the above embodiment include that the object is the inside or the outside of a motor vehicle. Preferably, the first material includes metal, laminated material, fiber reinforced material, or plastic, and the second material preferably includes fiberglass or poly-paraphenylene terephthalamide (KEVLAR). The cell walls are preferably tapered. The expandable cellular structure may be linearly deployed or radially deployed. The apparatus may optionally include a flexible cover, where the flexible cover is configured to receive a projectile. The apparatus may optionally include a flexible cover, where the apparatus serves as a floatation device.

According to another preferred embodiment of the invention, an apparatus for protecting an object from impact is provided. The apparatus includes an expandable cellular structure disposed between a first surface and a second surface, where the first surface is hingedly attached to the object. The expandable cellular structure includes a plurality of cell walls and a plurality of cell joints. Each of the plurality of cell walls has a maximum thickness, and the maximum thickness is greater than the thickness of each of the plurality of cell joints. The apparatus is configured to be deployed prior to an impact upon the object.

Various optional and preferable features of the above embodiment include that the object is the inside or the outside of a motor vehicle. The cell walls preferably include metal, laminated material, fiber reinforced material, or plastic, and the cell joints preferably include one of fiberglass and poly-paraphenylene terephthalamide (KEVLAR). The cell walls are preferably tapered. The expandable cellular structure may be linearly deployed or radially deployed. The apparatus optionally includes a flexible cover, where the flexible cover is configured to receive a projectile. The apparatus may optionally include a flexible cover, where the apparatus serves as a floatation device.

According to another preferred embodiment of the invention, an apparatus for protecting an object from impact is provided. The apparatus includes an expandable cellular structure including a plurality of cell walls and a plurality of cell joints. The expandable cellular structure is disposed between a first surface and a second surface, and at least one of the first surface and the second surface is attached to the object with an attachment. The cell walls are substantially more rigid than the cell joints. The apparatus is configured to be deployed prior to an impact upon the object.

Various optional and preferable features of the above embodiment include that the object is the inside or the outside of a motor vehicle. The cell walls preferably include metal, laminated material, fiber reinforced material, or plastic, and the cell joints preferably include fiberglass or poly-paraphenylene terephthalamide (KEVLAR). The cell walls are preferably tapered. The expandable cellular structure may be linearly deployed or radially deployed. The apparatus may optionally include a flexible cover, where the flexible cover is configured to receive a projectile. The attachment preferably includes a hinge. The apparatus may optionally include a flexible cover, where the apparatus serves as a floatation device.

According to another preferred embodiment of the invention, an apparatus for protecting an object from impact is provided. The apparatus includes an expandable cellular structure disposed between a first surface and a second surface, where the first surface is attached to the object with an attachment. The expandable cellular structure includes a plurality of cell walls and a plurality of cell joints. The plurality of cell walls include at least one of metal, plastic, poly-paraphenylene terephthalamide (KEVLAR), reinforced paper, resin impregnated paper, laminate, and fiber reinforced material. The plurality of cell joints include at least one of fiberglass and poly-paraphenylene terephthalamide (KEVLAR). The apparatus is configured to be deployed prior to an impact upon the object.

Various optional and preferable features of the above embodiment include that the object is the inside or the outside of a motor vehicle. The cell walls are preferably tapered. The expandable cellular structure may be linearly deployed or radially deployed. The apparatus may optionally include a flexible cover, where the flexible cover is configured to receive a projectile. The attachment preferably includes a hinge. The apparatus may optionally include a flexible cover, where the apparatus serves as a floatation device.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein:

FIG. 1 illustrates various states of radial deployment, from packed to fully deployed, of a cellular structure of the present invention.

FIG. 4 illustrates a deployable cellular structure of the prior art.

FIG. 5 illustrates an embodiment of the cellular structure having continuous fabric joint material.

FIG. 13 is a schematic diagram of a linear deployment mechanism that may be deployed manually.

DETAILED DESCRIPTION OF THE EXEMPLARY EMBODIMENT

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Referring now to FIG. 1, an impact energy absorber 100 according to a preferred embodiment of the invention is shown in various stages of deployment. In its packed form 110, the energy absorber has a relatively flat profile, which allows it to remain inconspicuous and occupy relatively little space compared to when it is fully deployed 130.

The impact energy absorber 100 deploys radially, in that it opens like a book to deploy the expandable cellular structure. The two opposing outer surfaces of this embodiment are joined at one edge by a hinge, which allows the surfaces to rotate apart to expand the cellular structure. In practice, radially deployed cellular structures may be opened more or less than 180°, depending on the particular application.

Figure 2A:
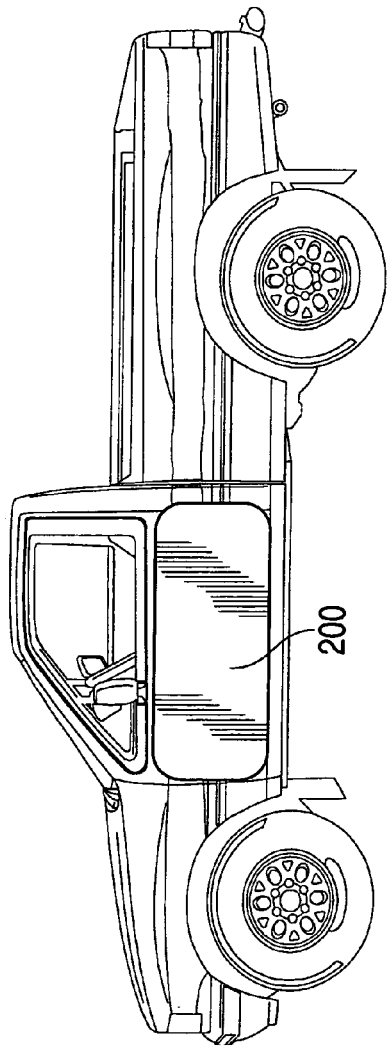
FIG. 2 illustrates the structure of FIG. 1 mounted on the side of a vehicle in packed and deployed states.
Figure 2B:
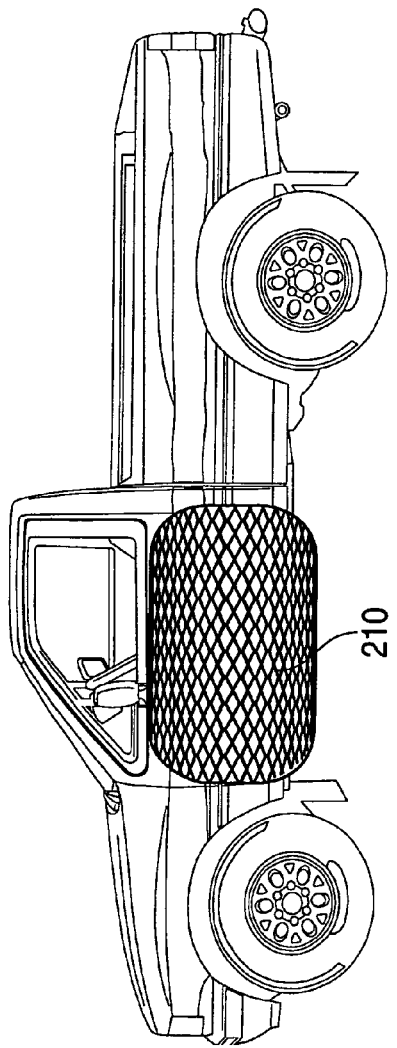

Referring now to FIG. 2, the impact energy absorber of FIG. 1 is shown in both a packed state 200 and deployed state 210 on an automobile. This configuration demonstrates a side impact protection application for automobiles.

Figure 3:
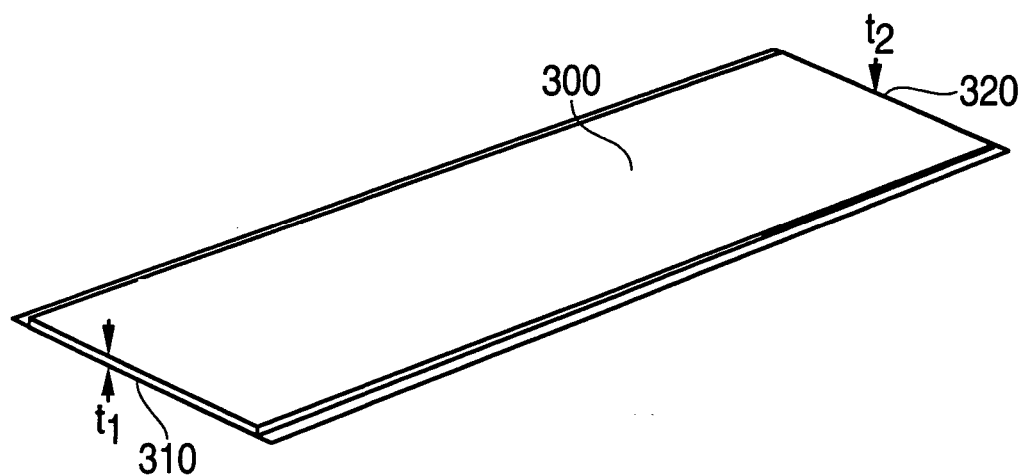
FIG. 3 is a schematic diagram of an isolated cell wall of an embodiment of the cell structure.

FIG. 3 illustrates a cell wall 300 of a preferred embodiment having anisotropic properties. The thickness of the cell wall 300 is generally tapered along the cell axis to enable precise load tailoring along the crush-stroke. Typically, the thicker portion 310 of the cell wall is nearest to the object being protected from impact while the thinner portion 320 is positioned to receive the impacting object ($t_1 > t_2$); however, this orientation may be reversed. An object impacting a deployed cellular structure having cell walls tapered as illustrated in FIG. 3 will meet with increasing mechanical resistance along the crush-stroke as the impacting object nears the thicker portion of the cell wall 310.

Other types of cell wall thickness gradients could be used to control energy absorber crush response. For example, tapering the cell wall at strategically selected areas such as the outer edge can help reduce or eliminate the initial impulsive load, which is typical in the dynamic impulse response of conventional cellular impact absorbing structures. Such cell wall tapering allows for precise crush-stroke energy absorption adjustments by the manufacturer. This load tailoring mechanism by selective thinning and tapering is particularly useful when designing crash energy management devices for manned vehicles or other applications designed to protect humans.

There are several ways to construct the cell walls and affect cell wall thickness gradients. Materials including metals, plastics, papers, polymers (e.g., KEVLAR), fiberglass, and others could be used alone or laminated to allow local thickness build-up without having to machine the cell-walls. Laminated fiber-reinforced plastics or other materials may be used where layers are terminated appropriately during the lay-up process to achieve a taper or gradient. Alternately, the cell walls may be molded. Cell walls may also be constructed of resin-impregnated paper. The aforementioned examples are for illustration purposes only and are not meant to limit the types of materials or construction techniques useable for the cell walls.

Turning now to details of the joints between the cells, FIG. 4 depicts a prior art cellular structure having homogenous cell walls 420 and glued cell joints 410. One disadvantage of this construction is that the cell joints 410 are usually more stiff than the cell walls. To increase the energy absorption capability of this device, the cell walls may be constructed from a stronger material. As a result, the joints 410 would also be strengthened. However, the deployment force increases with the strength of the cell joints, thus making for a slower and more difficult deployment. Applications of this type of prior art deployable cellular structure with identical cell walls and cell joints are limited to those whose impact energy absorption requirements can be satisfied by relatively weak materials such as paper.

FIG. 5 illustrates a preferred embodiment having a fabric overlay 510, which acts as a flexible cell joint. Overlay 510 provides cell joints 520 constructed from a different material (e.g., fiberglass, KEVLAR or SPECTRA) than the cell walls. This heterogeneous construction allows the cell walls to be constructed from very strong and stiff material (e.g., metal) while maintaining low deployment force requirements due to the more flexible cell joints. Thus, this embodiment has superior impact energy management capability when compared to paper cellular structures, without requiring additional deployment force.

Fabric overlay 510 may be attached to cell walls 530, and cell joints 520 may be attached to each-other in various ways. The joints may be glued using, by way of nonlimiting example, Hot Melt Adhesive 3789 or epoxy adhesives DP-460 or DP-420, all manufactured by 3M. The joints may instead be stitched using a high-strength thread made from, by way of nonlimiting example, KEVLAR. The joints may also be both glued and stitched for increased strength. The cell walls may be attached to the fabric overlay using either or both of the aforementioned gluing or stitching techniques, or may instead be bonded to the fabric overlay with resin. Resin-impregnated fabric may also be suitable.

Figure 6:
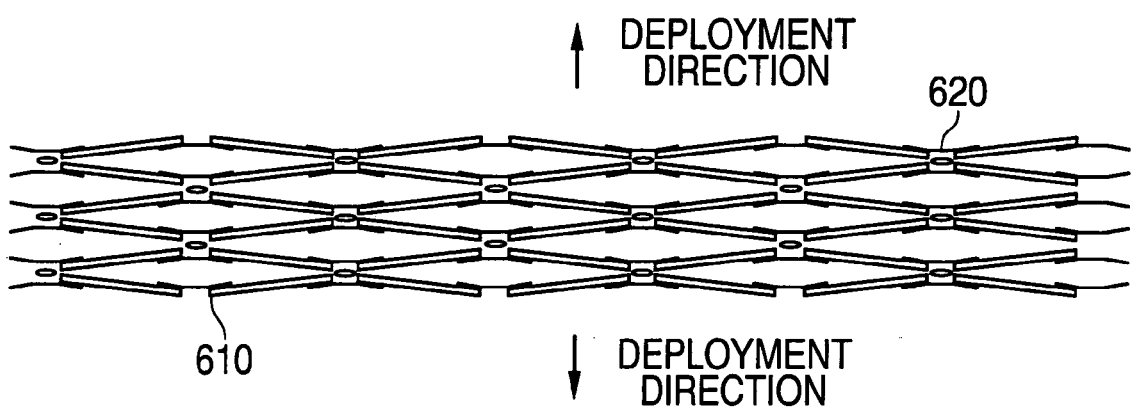
FIG. 6 illustrates an embodiment of the cellular structure having discontinuous fabric joint material.

FIG. 6 illustrates a preferred embodiment that uses strips of fabric 610 for the cell joints. The cell joints 620 and cell wall attachments may be formed in the manner described above in reference to FIG. 5. The embodiment of FIG. 6 requires less fabric material than the embodiment of FIG. 5.

Figure 7:
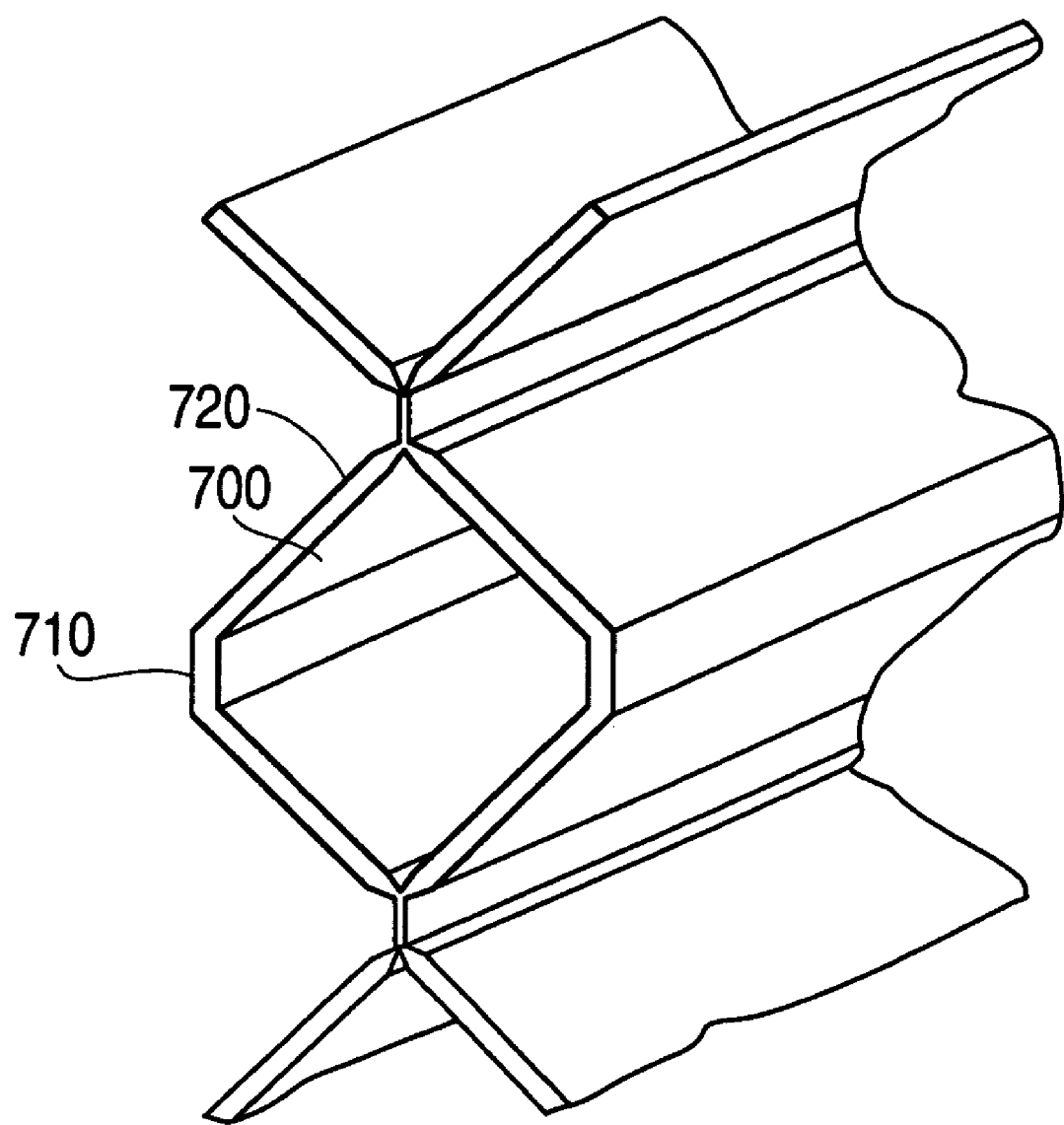
FIG. 7 illustrates an embodiment of the cellular structure in which the cell wall is made of the same material as the cell joint but is thicker than the cell joint.

FIG. 7 illustrates details of a single cell 700 in an alternate embodiment. Cell walls 720 and cell joints 710 are made from the same materials, but cell joints 720 are thinner than the cell walls. This thinning may be accomplished by using a laminated fiber reinforced wall material. However, other materials could be used. This construction has advantages similar to those of the embodiments depicted in FIGS. 5 and 6 in that thicker cell walls provide increased impact energy absorption capability, and thinner and therefore typically more flexible joints allow for low deployment force requirements.

Figure 8:
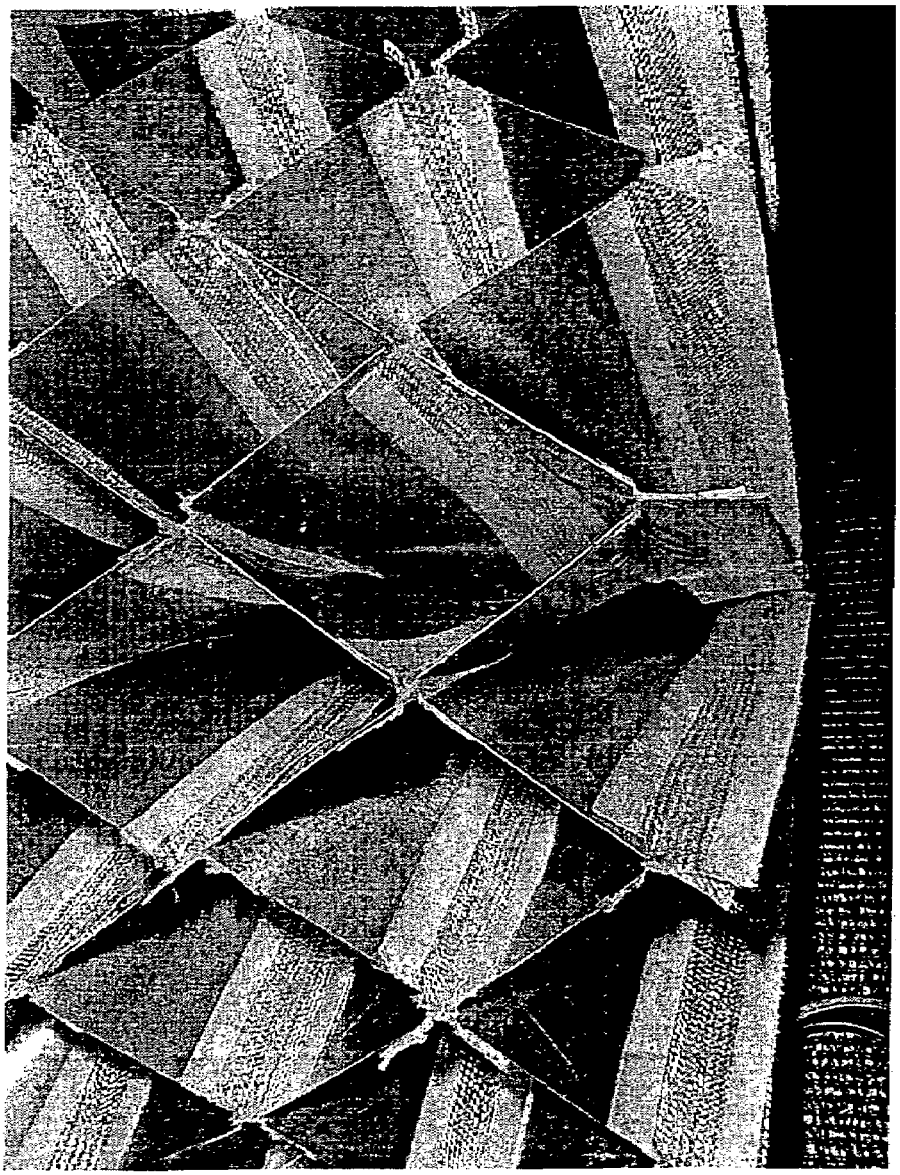
FIG. 8 illustrates the embodiment in FIG. 6 in a sate of radial deployment as in FIG. 1.

FIG. 8 depicts an embodiment positioned with the impact area at the near end. The cell walls are constructed from 1/64th inch 2024 aluminum and the cell joints are constructed from fiberglass cloth. The cell joints were effected by bonding the fiberglass cloth to the cell walls using a thermoplastic adhesive. The aluminum cell walls thus provide substantial impact absorption, and the choice of material for the cell joints ensures low deployment force requirements. As is apparent from the wedge-shaped cells, this embodiment is deployed radially.

Figure 9:
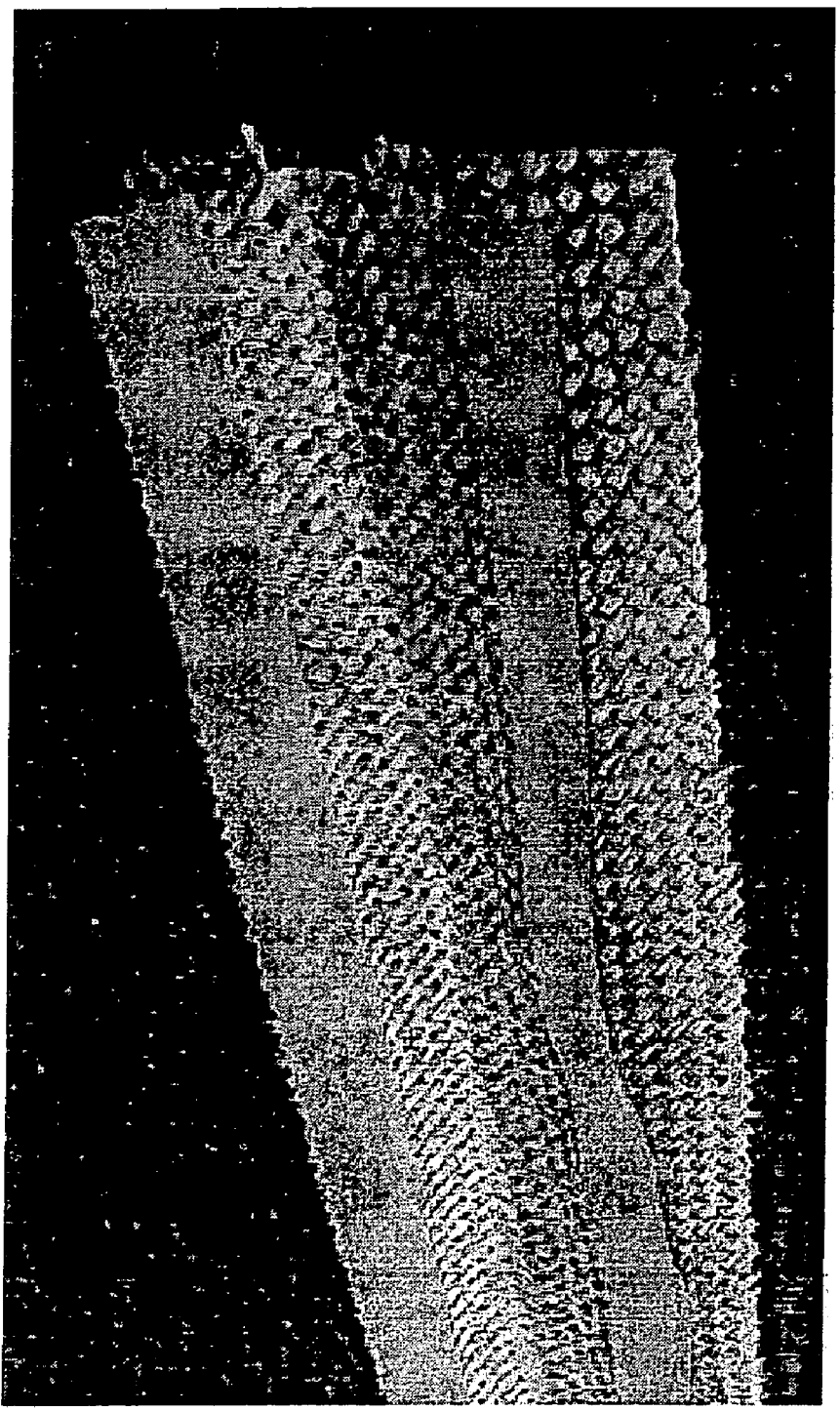
FIG. 9 illustrates a close-up of the cell joint in FIG. 8.

FIG. 9 depicts the fiberglass cloth used for the cell joints in the embodiment of FIG. 8. By orienting the fibers at ±45° to the edge of the cell wall edges as shown in FIG. 9, the deployable cellular structure exhibits superior shear rigidity. That is, the deployed cellular structure is highly resistant to shear and requires low deployment force when high stiffness and high strength fibrous cloth is used for the cell joints with the fibers oriented at ±45° to the cell wall edges. Other factors that are relevant to cell joint material choice include cost, energy absorber weight requirements, and overall crush performance for a given application. The edges of the fiberglass cloth in the embodiments of FIGS. 8–10 were taped to prevent fraying. The tape does not otherwise contribute to the functionality of these embodiments. If non-fraying strips of cloth of the appropriate material could be manufactured with the fibers oriented at ±45° to the strip edge, the tape may be eliminated.

Figure 10:
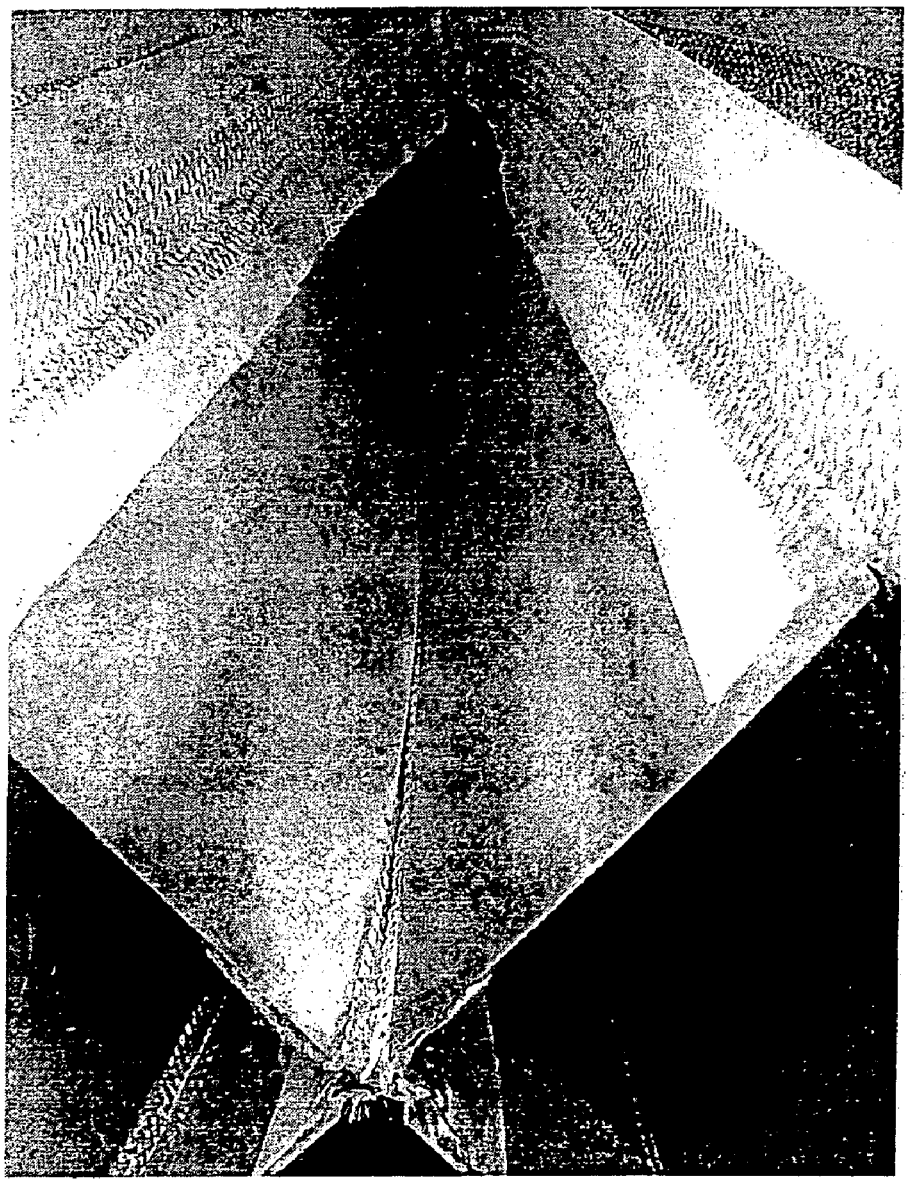
FIG. 10 illustrates a close up of the cellular structure of FIG. 8.

FIG. 10 depicts a close up of an individual cell in the embodiment of FIG. 8. To effectively deploy a radially deployed cellular structure, the cell walls should preferably admit some amount of longitudinal twist. Because the edge of each cell abutting the structure's hinge are all oriented in the same direction, the cell walls will twist in order to allow for the opposite end of the cell walls to have varying orientations. As illustrated in FIG. 10 for example, the edges of the cell walls at the far end, closest to the object being protected from impact, are oriented horizontally. The near edges of the cell walls (i.e., those designed to receive the impacting object) have varying orientations due to the cellular structure of the device. Using tapered cell walls, as illustrated in FIG. 3 for example, will allow for the cell walls to twist in natural response to deployment. Alternately, or in addition, longitudinally oriented fiber reinforcements can provide impact strength while allowing twisting. Typically, in a fiber-reinforced cell wall, a large proportion of the fibers are oriented longitudinally, that is, along the long axis of the cell walls; however other fiber orientations are also possible.

Figure 11A:
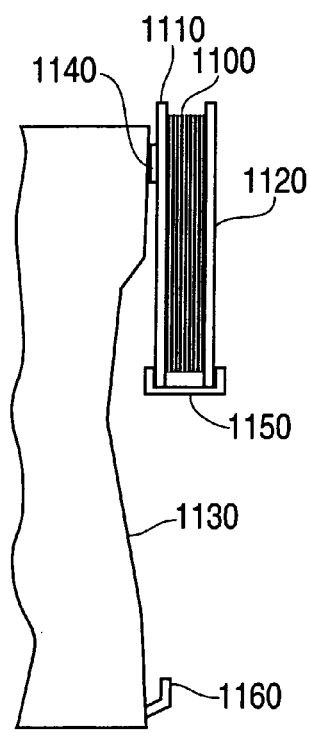
FIG. 11 is a schematic diagram of a radial deployment mechanism which may be released manually.
Figure 11B:
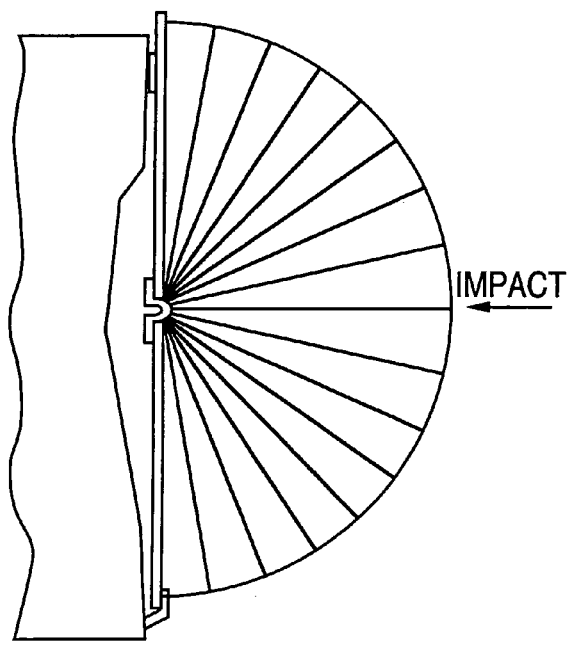

FIG. 11 illustrates a manual deployment mechanism for a radially-deployed cellular structure. The packed cellular structure 1100 is sandwiched between two rigid plates 1110, 1120, and hung on the surface of the object to be protected 1130 via attachment 1140. Inner plate 1110 is thereby fixed to the protected surface. The device may optionally include a clasp holding together plates 1110 and 1120. The device is deployed manually (e.g., by hand) by pulling away the outer plate 1120 and allowing the device to swivel along hinge 1150. When the cellular structure is fully extended, the outer plate is secured via latch 1160.

The cellular structure may be extended greater or less than 180°, depending on the application and the shape of protected surface 1130.

If the device is dedicated to protecting a particular object, the deployment mechanism may be modified by omitting the inner plate and directly attaching the inner side of the cellular structure to the protected surface. The embodiment of FIG. 11, however, has the advantage of being removable via attachment 1140. When removed from the surface to be protected, the device may be conveniently stowed due to its relatively small size. Depending in part on the size and mass of the energy absorber, hinge 1150 may be elastic to aid in deployment or repacking. That is, hinge 1150 can be configured to include a spring component that assists in either opening or closing. Of course, the energy absorber of FIG. 11 may be repacked by simply closing it and securing the outer plate if necessary.

Figure 12A:
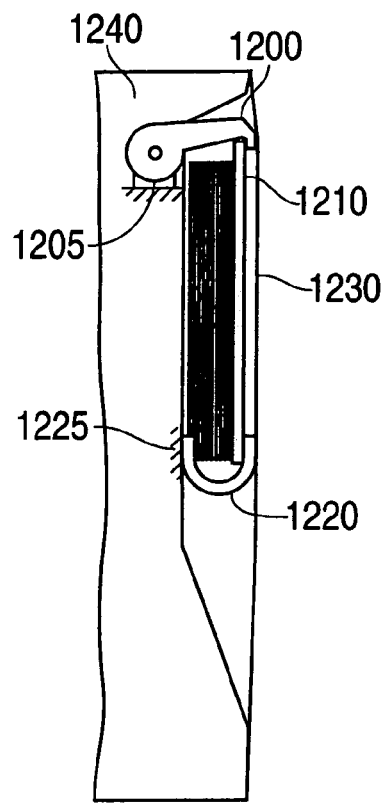
FIG. 12 is a schematic diagram of a radial deployment mechanism that may be released automatically.
Figure 12B:
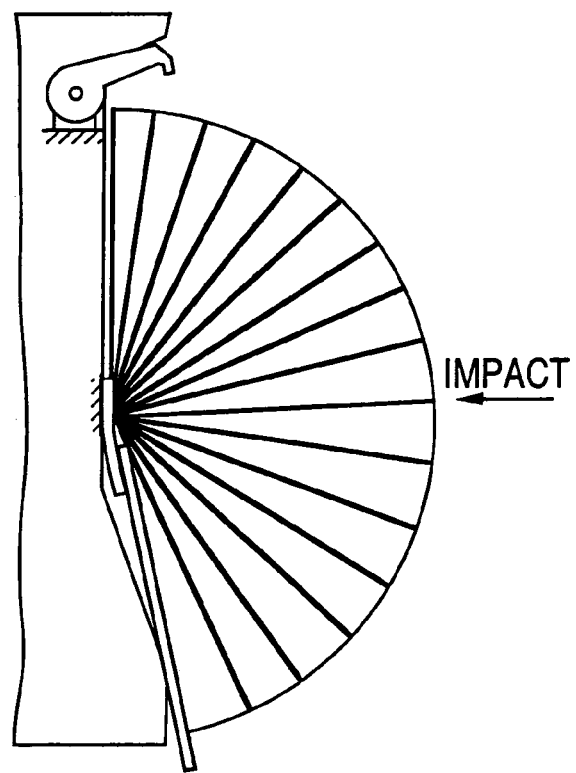

FIG. 12 depicts an automatic deployment mechanism for a radially deployed cellular structure. For automatic deployment, the structure is packed in a manner similar to that of manual deployment. Additionally, a servo controlled latch or solenoid pin 1200 is incorporated at 1205 to release the outer plate 1210. High torque elastic hinge 1220 fastened to the surface to be protected 1240 at 1225 then automatically expands the cellular structure by swinging out rigid plate 1210. Alternately, a hydraulic mechanism may be substituted for elastic hinge 1220. Hydraulic and servo actuators have an advantage of being reversible to repack the cellular structure automatically. Cover 1230 provides favorable aerodynamic or aesthetic qualities if desired. Cover 1230 may be pre-scored or weakened at strategic locations in order to facilitate easy or predictable removal when struck by outer plate 1210.

Note that automatic deployment typically involves a triggering mechanism for latch 1200. Such mechanisms are known in the art and will not be discussed in detail here. Usually triggering systems involve sensors, data acquisition, and data processing components. The systems may include multiple sensors, such as a proximity sensor to indicate how close a potentially impacting object is, and a rate sensor to indicate how fast the impacting object is approaching. The mechanisms may include additional sensors, including redundant sensors. Known triggering mechanisms include those used for conventional automotive airbags. With appropriate triggering and automatic deployment mechanisms, the preferred embodiment may be fully deployed in a time interval on the order of tens of milliseconds.

In an alternate embodiment, expandable cellular structures may be deployed linearly as discussed below in reference to FIGS. 13–15. In a linearly deployed cellular structure, the opposing outer surfaces of the packed cellular structure are generally not jointed together by a hinge. To deploy such a structure, the opposing surfaces are moved apart along an axis perpendicular to each surface. This expands the cellular structure in an accordion-like manner, allowing for a structure having a profile with characteristics different from a radially-deployed embodiment.

FIG. 13 illustrates a manual deployment mechanism for a linearly deployable cellular structure. The cellular structure 1300 is sandwiched between end plates 1310 and 1320, and attached to rigid plate 1330 via hinge 1340. Rigid plate 1330 is then attached to the surface to be protected 1350. Depending on the shape of the surface to be protected, rigid plate 1330 may be eliminated and the cellular structure attached directly. For deployment, the sandwiched cellular structure is swung out manually (e.g., by hand), away from the surface to be protected 1350, and then extended along guide wires or guide rails 1360. These guide wires or rails 1360 are used to prevent lateral sway, but may be omitted. Other known mechanisms for preventing lateral sway may be used. Note that even though the linearly deployed cellular structure is subject to transverse movement, the preferred embodiment has superior transverse shear rigidity, which is useful for absorbing impacts that are not perpendicular to the plane of the surface to be protected. If the energy absorber is appropriately oriented, gravity can provide the force necessary to extend the cellular structure along the guide wires or rails. In alternative embodiments, plates 1310, 1320 and 1330 may be flexible or shaped to conform with the surface to be protected or to appeal to utilitarian or aesthetic considerations. Repacking is accomplished by following the deployment steps in reverse order.

Figure 14:
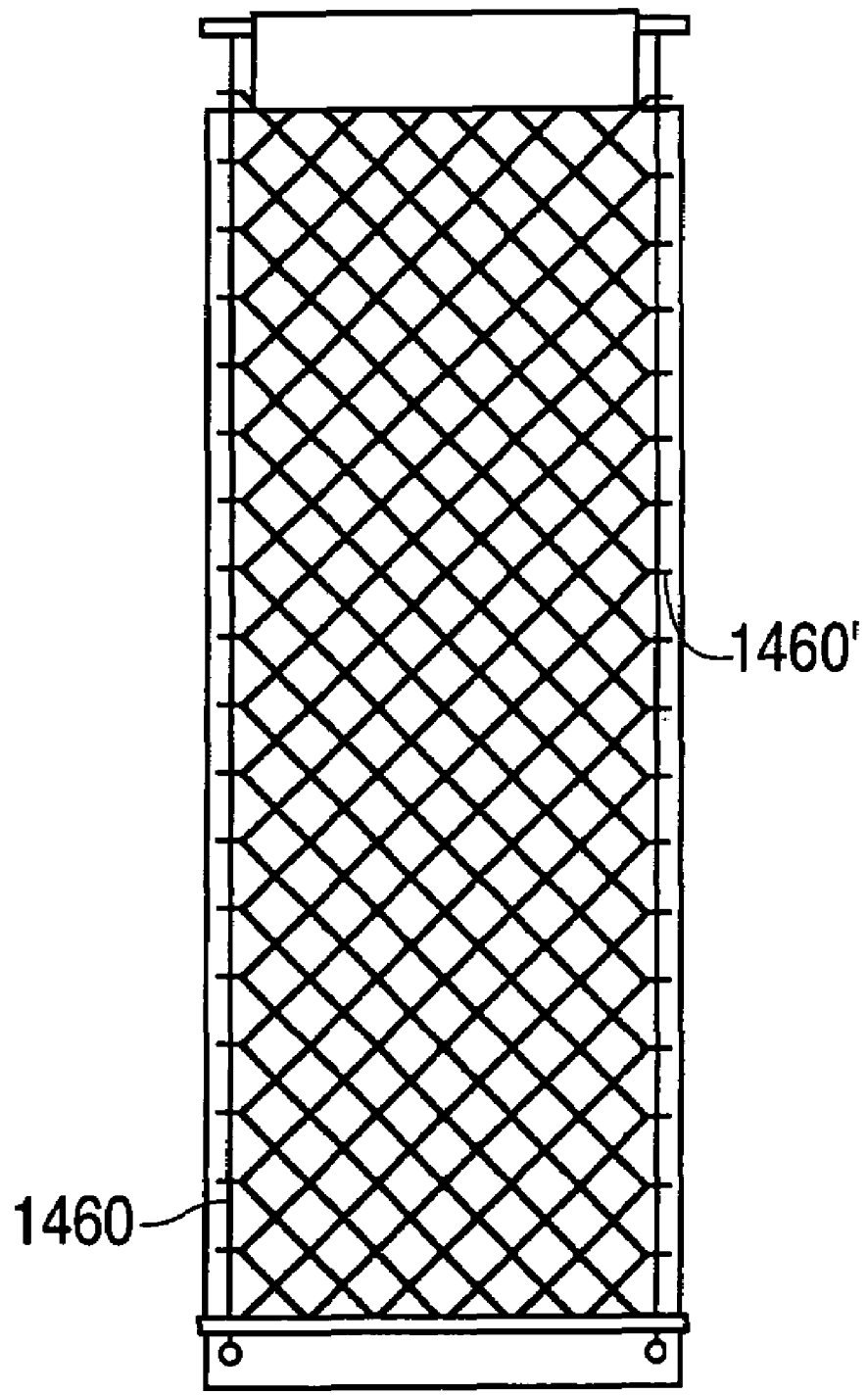
FIG. 14 illustrates section AA' of the linearly deployed energy absorber of FIG. 13.

FIG. 14 is a view of the deployed energy absorber of FIG. 13 taken along the plane defined by line AA' and parallel to plate 1330. Guide wires or rails 1460, 1460' providing lateral support are visible in this view.

Figure 15A:
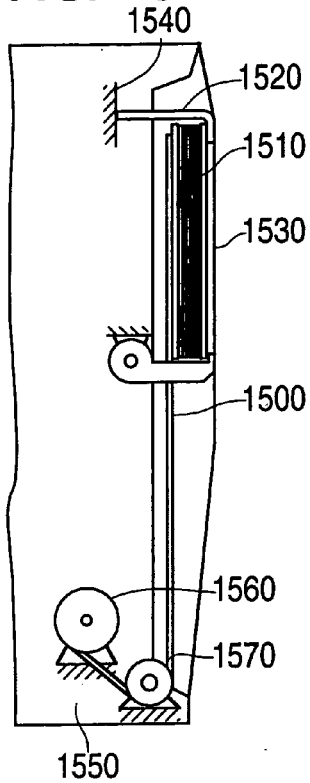
FIG. 15 is a schematic diagram of a linear deployment mechanism that may be released automatically.
Figure 15B:
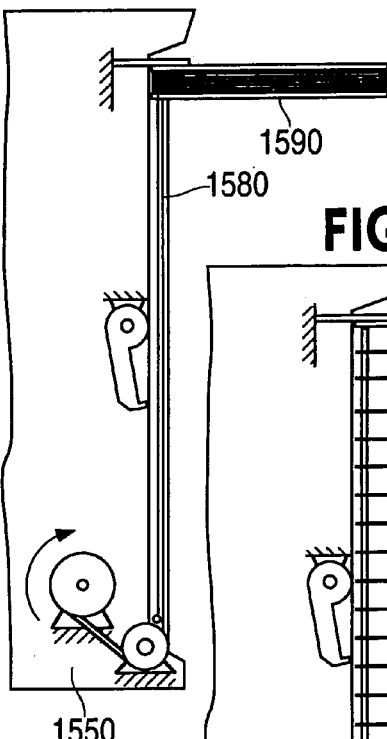
Figure 15C:
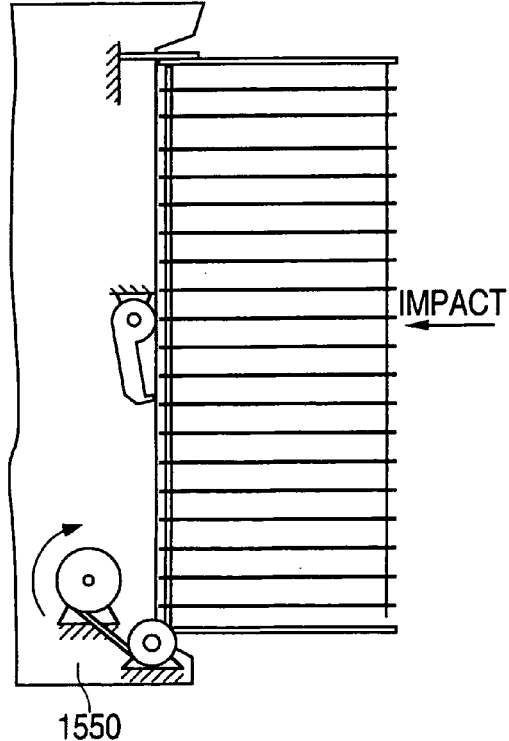

FIG. 15 illustrates an automatic deployment mechanism for a linearly deployed cellular structure. To fully deploy, two phases are effected: an initial rotational phase and a subsequent linear phase. Servo controlled latch or solenoid pin serves to hold the packed energy absorber 1510 in place. When released, high torque elastic hinge or hydraulic mechanism 1520 attached at 1540 swings the packed cellular structure 1510 out through frangible cover 1530 to be perpendicular to the surface to be protected 1550. This concludes the rotational phase. To accomplish the subsequent linear phase, motor or servo mechanism 1560 reels in cable 1580 attached to lower end plate 1590 via pulley 1570. If appropriately positioned, gravity may also assist in the linear deployment phase.

The deployment mechanism examples of FIGS. 11–15 are not limiting. Other deployment mechanisms may be used. Examples of such deployment mechanisms include those that rely on explosives or springs to place the cellular structure in position to receive an impact.

Figure 16:
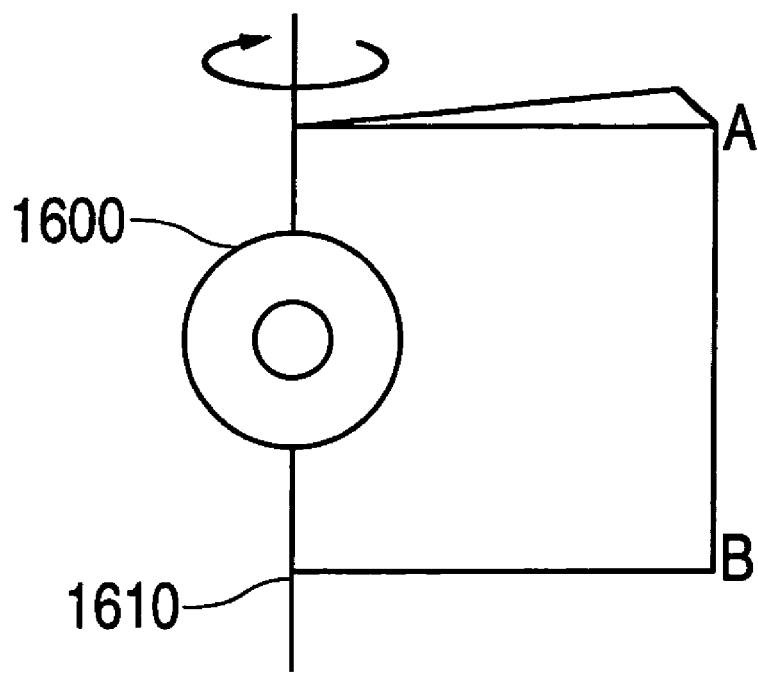
FIG. 16 illustrates an embodiment of the invention in which the cell structure of the present invention is configured to deploy radially to enclose an object.
Figure 17:
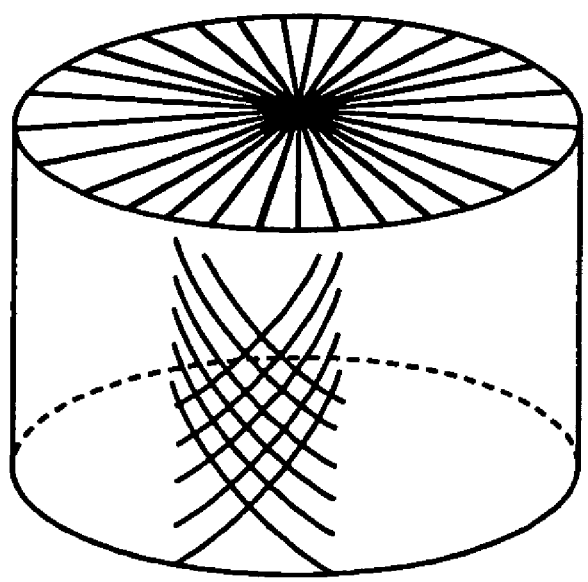
FIG. 17 illustrates the embodiment of FIG. 18 in which the cell structure is fully deployed to enclose the underlying object.

FIGS. 16 and 17 illustrate an embodiment that may be used to completely encapsulate an object to be protected 1600. By radially deploying the cellular structure 360° about axis 1610, object to be protected 1600 is surrounded by energy absorbing cells. The cellular protection may be spherical by appropriately rounding the corners of the stowed energy absorber at A and B. Applications of this embodiment include packaging valuable goods for shipment and precise aerial delivery without need for a parachute.

Figure 18A:
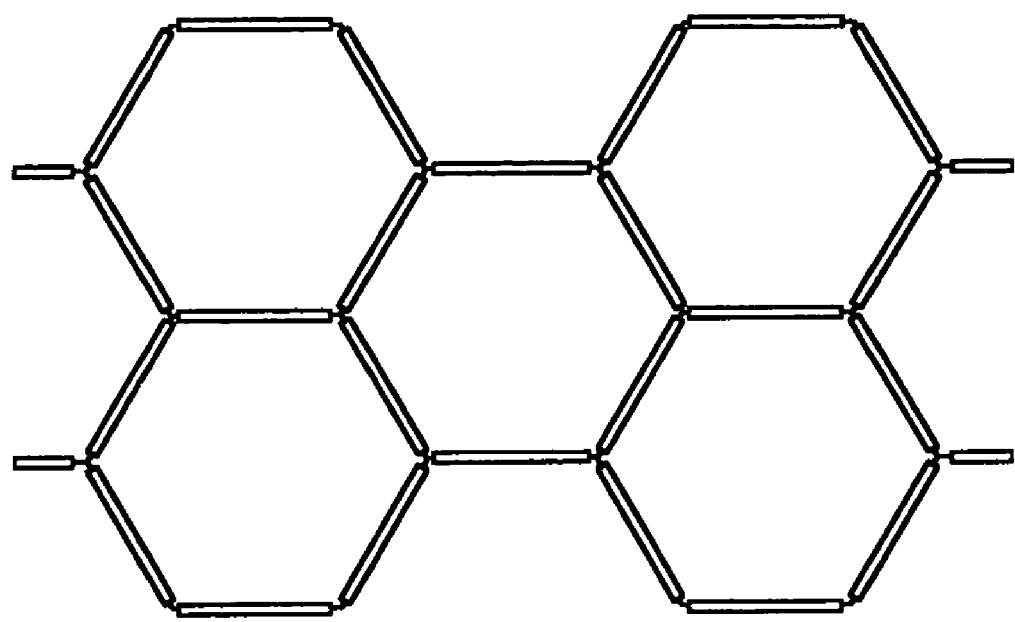
FIG. 18 depicts two possible cell shapes for the cell structure.
Figure 18B:
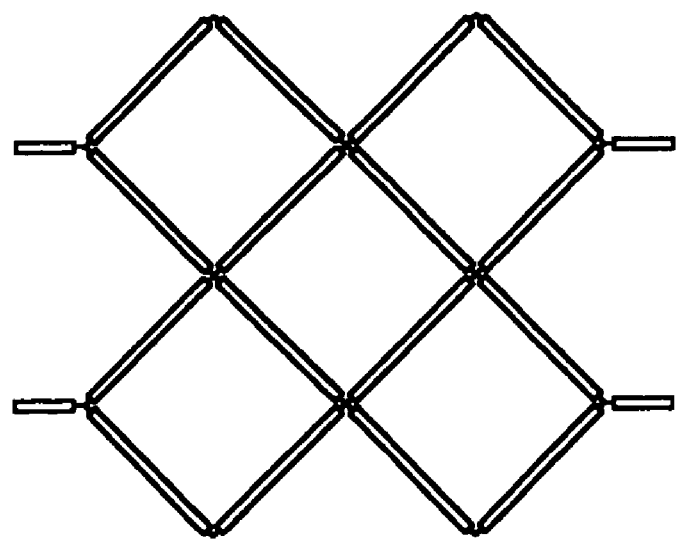

FIG. 18 depicts two possible cellular shapes for the preferred embodiments of the present invention. Both hexagonal and rhomboidal shapes are illustrated. However, other shapes may be used including but not limited to octagonal. Two different shapes, including but not limited to square and octagonal, may be present simultaneously.

Figure 19A:
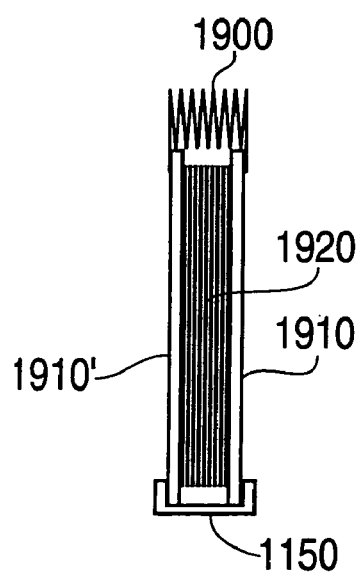
FIG. 19 is a schematic diagram of the radial deployment mechanism of FIGS. 11 or 13 with a deployable projectile cover.
Figure 19B:
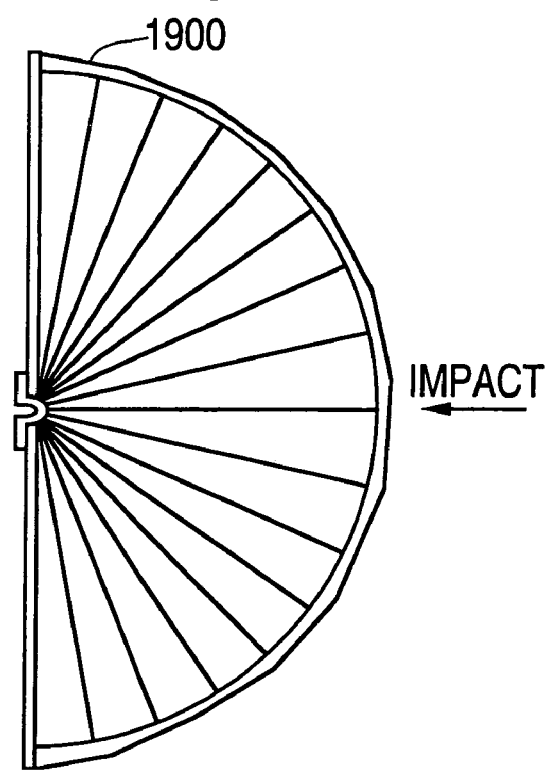

FIG. 19 depicts an alternate embodiment of the invention, which may be used to protect an object against projectiles by incorporating a tough but flexible cover 1900 over the outer surface of the expanded energy absorber. Such a cover 1900 is preferably constructed of several layers of finely woven KEVLAR. Cover 1900 may be secured to rigid plates 1910, 1910' and deployed with energy absorber 1920 so that it makes contact with but is not attached to the outer surface of the energy absorber. Alternately, the cover may be attached to the outer surface of the cellular structure using stitching and/or gluing as discussed above in reference to FIG. 5. Cover 1900 serves to capture projectiles without being penetrated, thereby exposing a large surface area of the energy absorber to the kinetic force of the projectile. Such covers may be used over both radial and linear deployment embodiments.

The preferred embodiments have a variety of applications. They may be used both internally and externally on motor or other vehicles to protect both the occupants and the vehicle itself. Embodiments used in this manner may be removable for storage. Both automatic and manual deployment embodiments are useful for vehicular applications. The devices may be stowed when not in use.

Another embodiment can be used as a highway crash barrier. These barriers may stand alone or be part of a vehicle such as a road work crew vehicle. Even police cruisers could be equipped with such a device to avoid sacrificing the vehicle when shielding a stranded motorist. This application particularly takes advantage of the ease of storage of the preferred embodiments when not in use. Crash barriers situated near roadways are particularly suited for manual deployment embodiments because users are generally aware in advance that the barriers may be exposed to impacting vehicles.

Many applications of the preferred embodiments arise in aviation. Planes and ground equipment alike can benefit from both automatic and manual deployment embodiments. Helicopters in particular can employ either embodiment for use when "crash landing" or landing by way of autorotation. Preferably, embodiments situated on or under helicopters include mechanisms to repack the cellular structure automatically. This has the advantage of allowing an incapacitated helicopter to land in its usual manner on its own landing gear should the helicopter regain flight capability merely by repacking the device, and without requiring that the energy absorption device be jettisoned prior to or damaged during landing.

Aircraft in general and helicopters in particular may also employ an embodiment having an outer cover as described above in reference to FIG. 19. By ensuring that the outer cover is waterproof, such an embodiment has the advantage of serving not only as a crash-energy absorption device, but also a flotation device should the aircraft be forced to land over water. For this application the preferred embodiment has the flexible cover attached to the outer surface of the energy absorber using stitching and/or gluing techniques discussed above in reference to FIGS. 5 and 19. Such an embodiment provides redundancy by enclosing air inside each cell thereby ensuring buoyancy even after the energy absorber experiences crushing.

The preferred embodiments (both radially and linearly deployed) may take on a variety of shapes and sizes. The shape and size of the packed and deployed devices illustrated in the accompanying figures should in no way be construed as limiting. Examples of shapes include spherical, cylindrical, prismatoid, parallelepipedal, conical, and others. The shape of both the packed and deployed device is easily modifiable, and it is also possible to have two cellular structures that have different shapes when deployed, but have the same appearance when packed. The size of the preferred embodiments are also highly flexible. The device may be as small as several centimeters, and as large as many meters, depending on the particular application.

As used herein, the word "impact" between two objects means a collision, regardless as to whether one or both of the two objects are in motion and regardless as to which object is in motion.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. An apparatus for protecting an object from impact comprising:
   an expandable cellular structure disposed between a first surface and a second surface, said first surface being hingedly attached to said object;
   said expandable cellular structure comprising a plurality of cell walls and a plurality of cell joints; and
   each of said plurality of cell walls having a maximum thickness, said maximum thickness being greater than a thickness of each of said plurality of cell joints;
   wherein said apparatus is configured to be deployed prior to an impact upon said object.

2. The apparatus of claim 1 wherein said object is one of the inside and the outside of a motor vehicle.

3. The apparatus of claim 1 wherein said cell walls comprise one of metal, laminated material, fiber reinforced material, and plastic.

4. The apparatus of claim 1 wherein said cell joints comprise one of fiberglass and poly-paraphenylene terephthalamide.

5. The apparatus of claim 1 wherein said cell walls are tapered.

6. The apparatus of claim 1 wherein said expandable cellular structure is linearly deployed.

7. The apparatus of claim 1 wherein said expandable cellular structure is radially deployed.

8. The apparatus of claim 1 further comprising a flexible cover, wherein said flexible cover is configured to receive a projectile.

9. The apparatus of claim 1 further comprising a flexible cover, wherein said apparatus serves as a floatation device.

10. An apparatus for protecting an object from impact comprising:
   an expandable cellular structure comprising a plurality of cell walls and a plurality of cell joints;
   said expandable cellular structure being disposed between a first surface and a second surface, at least one of said first surface and said second surface being attached to said object with an attachment; and
   said cell walls being substantially more rigid than said cell joints;
   wherein said apparatus is configured to be deployed prior to an impact upon said object.

11. The apparatus of claim 10 wherein said object is one of the inside and the outside of a motor vehicle.

12. The apparatus of claim 10 wherein said cell walls comprise one of metal, laminated material, fiber reinforced material, and plastic.

13. The apparatus of claim 10 wherein said cell joints comprise one of fiberglass and poly-paraphenylene terephthalamide.

14. The apparatus of claim 10 wherein said cell walls are tapered.

15. The apparatus of claim 10 wherein said expandable cellular structure is linearly deployed.

16. The apparatus of claim 10 wherein said expandable cellular structure is radially deployed.

17. The apparatus of claim 10 further comprising a flexible cover, wherein said flexible cover is configured to receive a projectile.

18. The apparatus of claim 10 wherein said attachment comprises a hinge.

19. The apparatus of claim 10 further comprising a flexible cover, wherein said apparatus serves as a floatation device.

* * * * *

UNITED STATES PATENT AND TRADEMARK OFFICE
CERTIFICATE OF CORRECTION

| | | |
|---|---|---|
| PATENT NO. | : 7,040,658 B2 | Page 1 of 1 |
| APPLICATION NO. | : 10/755361 | |
| DATED | : May 9, 2006 | |
| INVENTOR(S) | : Sotirios Kellas | |

It is certified that error appears in the above-identified patent and that said Letters Patent is hereby corrected as shown below:

Title Page:

On the bibliographic data sheet of the patent, please change:

Related U.S. Application Data
(62) Division of application No. 10/230,468, filed Aug. 29, 2002, now Pat. No. 6,755,453.

to:

Related U.S. Application Data
(62) Division of application No. 10/230,368, filed Aug. 29, 2002, now Pat. No. 6,755,453.

Signed and Sealed this
Thirty-first Day of January, 2012

David J. Kappos
*Director of the United States Patent and Trademark Office*